United States Patent
Jahanian et al.

(10) Patent No.: US 9,871,540 B2
(45) Date of Patent: Jan. 16, 2018

(54) INTEGRATED REAL POWER DETECTOR (71) Applicant: QUALCOMM Incorporated, San Diego, CA (US)

(72) Inventors: Amin Jahanian, Irvine, CA (US); Faramarz Sabouri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 123 days.

(21) Appl. No.: 13/653,072

(22) Filed: Oct. 16, 2012

(65) Prior Publication Data
US 2014/0103906 A1   Apr. 17, 2014

(51) Int. Cl.
G01R 21/06 (2006.01)
G01R 21/133 (2006.01)
(Continued)

(52) U.S. Cl.
CPC .............. *H04B 1/0458* (2013.01); *H03F 1/56* (2013.01); *H03F 3/24* (2013.01); *H04B 17/104* (2015.01);
(Continued)

(58) Field of Classification Search
CPC .............. H04B 17/0005; H04B 1/0458; H04B 2001/0416; H04B 1/525; H04B 17/0057; H04B 17/0062; H04B 5/02; H04B 1/707; H04B 2201/70709; H04B 17/0007; H04B 17/0042; H04B 1/30; H04B 7/0682; H04B 7/0691; H04B 1/0092; H04B 1/408;
(Continued)

(56) References Cited

U.S. PATENT DOCUMENTS 6,351,683 B1   2/2002 Johnson et al.
6,989,712 B2   1/2006 Liu et al.
(Continued)

FOREIGN PATENT DOCUMENTS

WO   2007135235 A1   11/2007

OTHER PUBLICATIONS

International Search Report and Written Opinion—PCT/US2013/065282—ISA/EPO—dated Feb. 6, 2014.

*Primary Examiner* — Tung X Nguyen
*Assistant Examiner* — Lee Rodak
(74) *Attorney, Agent, or Firm* — QUALCOMM Incorporated (57) ABSTRACT

Techniques for calculating a real power delivered to a transmit load of a transceiver. In an aspect, two distinct voltages are sampled from a matching network coupling the transmit load to an amplifier output. The voltages are coupled by configurable coupling elements to the down-conversion mixers of the transceiver, and are subsequently converted to digital form for processing by a baseband processor. The baseband processor may calculate a coefficient relating the calculated real power to an actual power delivered to the load. The coefficient may be stored and subsequently applied to a transmit element during normal signal transmission by the transceiver. Note the coupling elements may be configured to decouple the sampled voltages from the down-conversion mixers during normal signal reception by the transceiver, thus avoiding unnecessary loading on the receive signal path.

24 Claims, 4 Drawing Sheets (51) Int. Cl.
*H04B 1/04* (2006.01)
*H04B 17/10* (2015.01)
*H04B 17/13* (2015.01)
*H03F 1/56* (2006.01)
*H03F 3/24* (2006.01)
*H04W 52/52* (2009.01)

(52) U.S. Cl.
CPC ..... *H04B 17/13* (2015.01); *H04B 2001/0416* (2013.01); *H04W 52/52* (2013.01)

(58) Field of Classification Search
CPC . H04B 1/69; H04B 1/109; H04B 1/48; H04B 17/104; H04B 17/13; H04B 1/18; H03F 1/56; H03F 3/24; H03F 11/56; H03F 2200/451; H04W 52/52; H03H 7/40; H03H 11/30
USPC ........ 324/128, 126, 142, 140 R, 141, 140 D, 324/522, 72.5; 455/69, 126, 115.2, 73, 455/550.1, 107, 115.1, 125; 375/130, 375/312, 219; 330/129, 51, 207, 130, 330/149, 151
See application file for complete search history.

(56) References Cited

U.S. PATENT DOCUMENTS

| | | |
|---|---|---|
| 7,586,384 B2 | 9/2009 | Ranta |
| 8,022,688 B2 | 9/2011 | You |
| 2005/0168211 A1* | 8/2005 | Camnitz et al. ............. 324/142 |
| 2009/0253385 A1 | 10/2009 | Dent et al. |
| 2009/0256644 A1 | 10/2009 | Knudsen et al. |
| 2010/0099369 A1* | 4/2010 | Ozgun et al. ................. 455/125 |
| 2010/0321086 A1* | 12/2010 | See et al. ...................... 327/359 |
| 2011/0063042 A1* | 3/2011 | Mendolia ................. H01P 5/04 333/17.3 |
| 2011/0086598 A1 | 4/2011 | Ali et al. |
| 2012/0171970 A1 | 7/2012 | Muhammad |

* cited by examiner

INTEGRATED REAL POWER DETECTOR

BACKGROUND

Field

The disclosure relates to integrated techniques for detecting real power delivered to the load of a transceiver.

Background

Modern radio-frequency (RF) integrated transceivers include circuitry for performing both transmit (TX) and receive (RX) functions on a single chip. The transmit processing circuitry may include, e.g., a TX signal generator, up-conversion mixers, a power amplifier for driving a TX load, etc. The receive processing circuitry may include, e.g., a low-noise amplifier, down-conversion mixers, filters, etc. A baseband processor may be coupled to the transceiver to perform digital operations associated with the TX and RX functionality.

The TX side of the transceiver may often be called upon to drive an off-chip load, such as an antenna for transmitting the TX signal wirelessly. When the load is coupled to the TX circuitry, the impedance of the load may sometimes be indeterminate, or may vary across different samples. For example, the antenna impedance may vary across different antenna samples, and/or the impedance of an interconnect coupling the antenna to a power amplifier of the TX circuitry may be indeterminate. The load impedance may accordingly alter the real power delivered by the transceiver to the load from its nominal value. Such alteration may undesirably result in excess power consumption.

Prior art techniques for addressing this issue include, e.g., using on-chip envelope detectors to estimate the actual power delivered to the off-chip load. However, such envelope detectors do not provide information on the real versus reactive components of the power delivered, as the phase information associated with the delivered power is generally lost during envelope detection. It would be desirable to provide efficient and accurate techniques for determining the real power delivered to a load by a transceiver, that are further readily suitable for on-chip integration with standard transceiver architectures.

SUMMARY

An aspect of the present disclosure provides an apparatus comprising: a matching network coupling an output of an amplifier to a load; first and second down-conversion mixers having inputs coupled to a received signal; coupling elements configured to selectively couple or decouple two distinct voltages sampled from the matching network to the inputs of the first and second down-conversion mixers; a processor configured to calculate a real power delivered to the load based on the outputs of the first and second down-conversion mixers.

Another aspect of the present disclosure provides a method comprising: configuring coupling elements to couple two distinct voltages sampled from a matching network to the inputs of first and second down-conversion mixers, wherein the matching network couples an output of an amplifier to a load; down-converting the two sampled voltages in frequency using the first and second down-conversion mixers; calculating a real power delivered to a load from the down-converted voltages; storing a coefficient derived from comparing the calculated real power to an actual power; configured the coupling elements to decouple the two distinct voltages from the inputs of the first and second down-conversion mixers; adjusting the amplitude or phase gain of a transmit element using the stored coefficient; and down-converting a received signal using the first and second down-conversion mixers.

Yet another aspect of the present disclosure provides an apparatus comprising:

means for matching the output of an amplifier to a load; means for selectively coupling or decoupling two distinct voltages sampled from the means for matching to the inputs of first and second down-conversion mixers; means for calculating a real power delivered to a load from the down-converted voltages.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
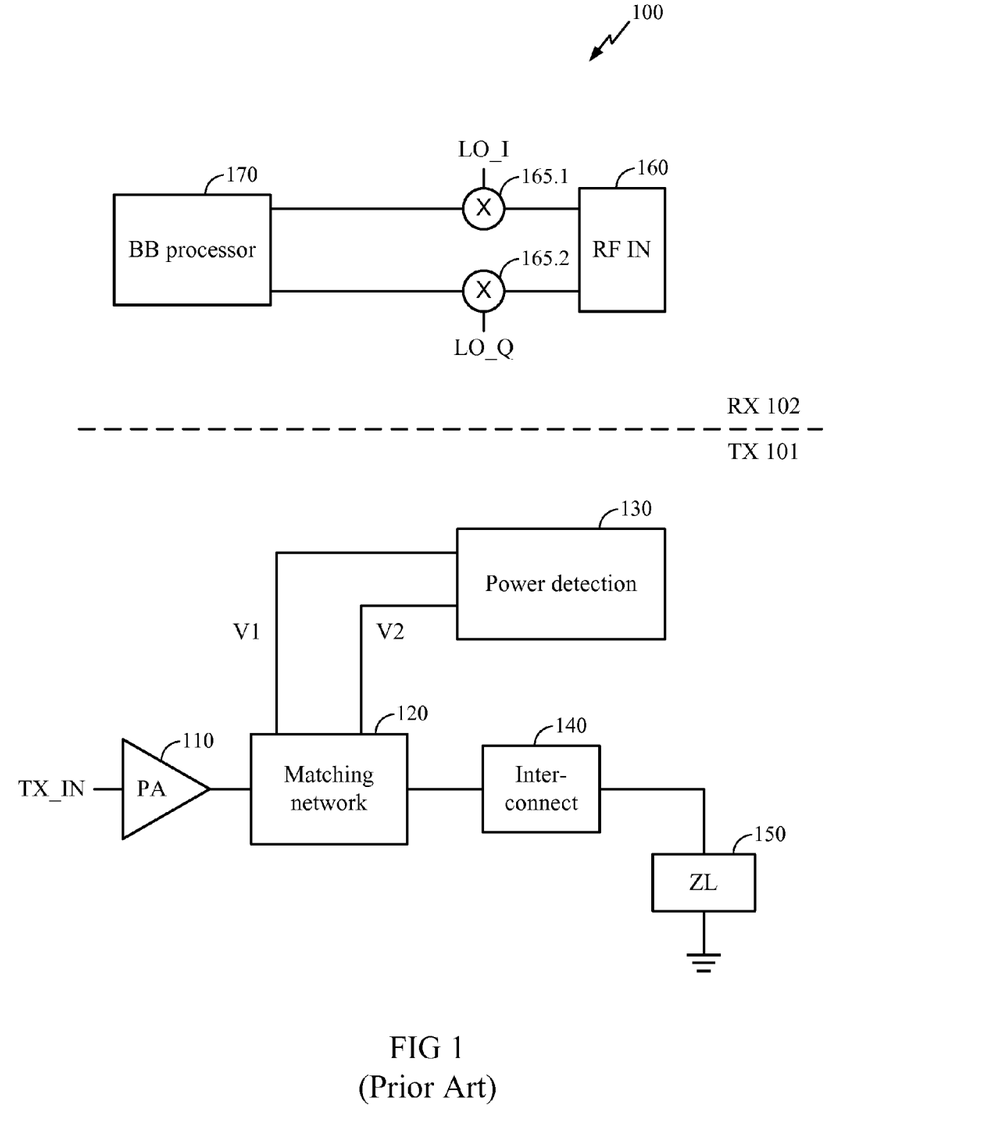
FIG. 1 illustrates a prior art scheme for determining power delivered to a load.

FIG. 1 illustrates a prior art scheme for determining power delivered to a load.

Note FIG. 1 is shown for illustrative purposes only, and is not meant to limit the scope of the present disclosure. It will be appreciated that various transmit (TX) and receive (RX) components known to one of ordinary skill have been omitted from FIG. 1 for ease of illustration. In FIG. 1, a transceiver 100 includes a TX portion 101 and an RX portion 102. The transceiver 100 may be implemented, e.g., as a wireless transceiver for a cellular phone, or any other type of communications device.

The RX portion 102 includes a radio-frequency (RF) input processing block 160, which may receive an RF signal over a transmissions medium, e.g., over a wireless medium using an antenna, and may further include elements such as a filter, low-noise amplifier, etc. (not shown in FIG. 1). The output of the block 160 may be provided to first and second down-conversion mixers 165.1, 165.2. The mixers 165.1, 165.2 may be configured to mix an RX signal with, e.g., in-phase and quadrature local oscillators (LO_I and LO_Q), respectively, to down-convert the RX signal for further processing by a baseband (BB) processing block 170. The block 170 may include, e.g., an analog-to-digital converter (ADC) and digital processing circuitry (not shown in FIG. 1). One of ordinary skill in the art will appreciate that the RX portion 102 may further include other components not shown, e.g., a trans-impedance amplifier following the down-conversion mixers 165.1, 165.2, filters, etc.

The TX signal portion 101 of the transceiver 100 includes a power amplifier (PA) 110. It will be appreciated that a PA 110 may amplify the power of an input RF TX signal (TX_IN) generated by various TX circuitry not explicitly shown in FIG. 1, e.g., a modulator, frequency up-converter, filter, etc., according to principles known in the art. The output of the PA 110 is coupled to a matching network 120, which is designed to match the output impedance of the PA 110 to the impedance associated with subsequent circuit elements, e.g., an interconnect 140 coupled to an off-chip load (ZL) 150, for optimal power delivery. The load 150 may be, e.g., an antenna for wirelessly transmitting a TX signal, and it will be appreciated that such antenna may be further shared with the RX portion 102.

To optimize power delivery from the PA 110 to ZL 150, it is desirable to determine the real power delivered to the load 150 during operation of the TX portion 101. In certain implementations, the amplitude and phase of voltages at distinct nodes within the matching network 120 may be sampled to calculate the power delivered to the load 150. For example, as shown in FIG. 1, voltages V1 and V2 may be sampled from distinct nodes within the matching network, and provided to power detection block 130. The power detection block 130 may be configured to determine both amplitude and phase information for each of the voltages V1 and V2. The block 130 may, e.g., compute the real power delivered to the load 150 based on the sampled voltages V1 and V2.

As V1 and V2 are sampled from the matching network 120 at the output of the PA 110, it is expected that they may be RF voltages, and may require processing in the RF domain to compute the power delivered to the load. One of ordinary skill in the art will appreciate that performing such a task at RF frequencies may require the design and use of additional RF processing circuitry, and may undesirably complicate the system. It would be desirable to provide simple and efficient techniques to sample the voltages required for computing the real component of power delivered to a load for a transceiver.

Figure 2:
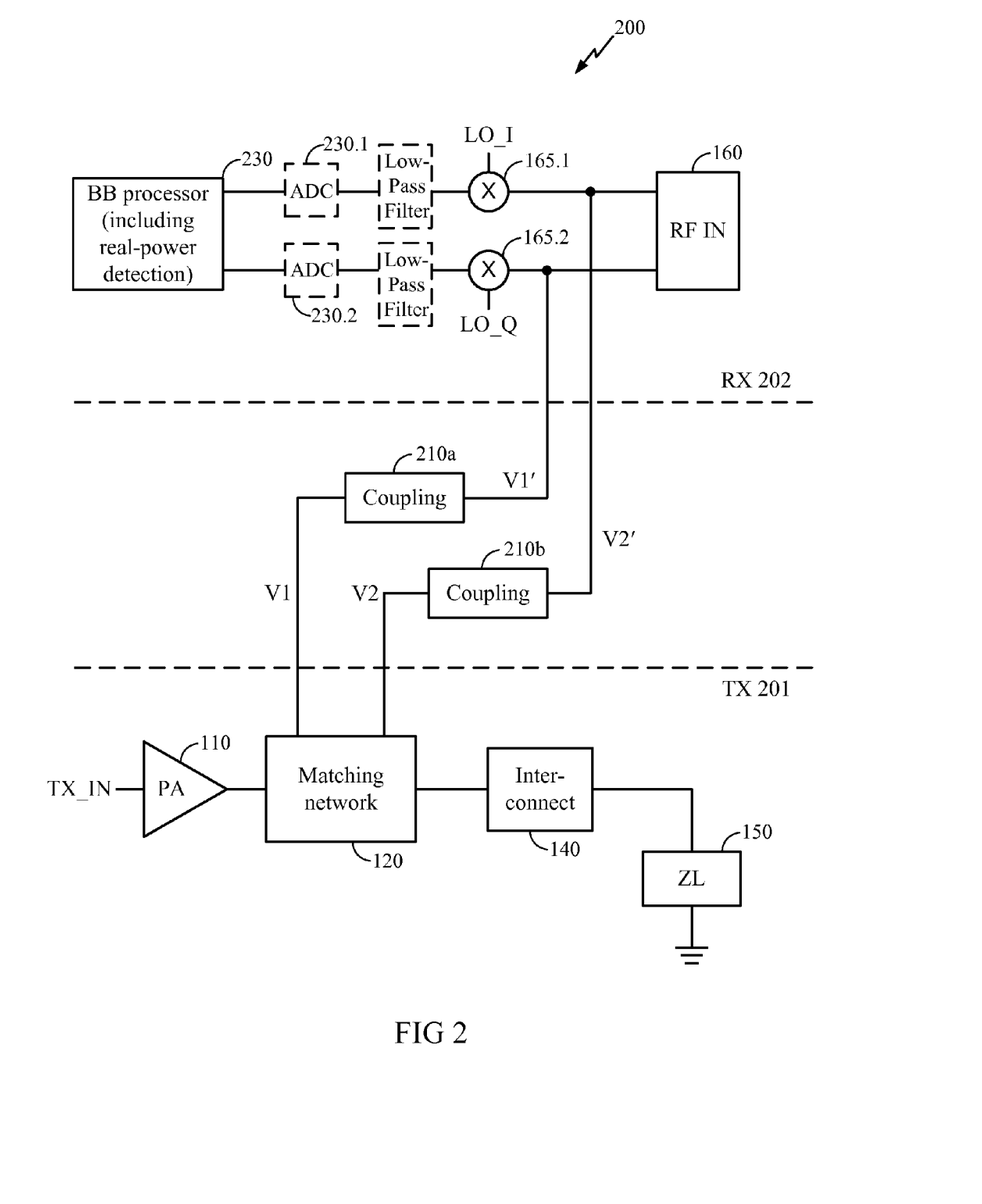
FIG. 2 illustrates an exemplary embodiment of a transceiver 200 according to the present disclosure.

FIG. 2 illustrates an exemplary embodiment of a transceiver 200 according to the present disclosure. Note FIG. 2 is shown for illustrative purposes only, and is not meant to limit the scope of the present disclosure to any particular architecture shown. Note elements labeled with corresponding numerals in FIGS. 1 and 2 may perform similar functionality, unless otherwise noted.

In FIG. 2, a TX portion 201 includes elements 110, 120, 140, and 150 as previously described hereinabove, with voltages V1 and V2 sampled from distinct nodes in the matching network 120. Similarly, an RX portion 202 includes elements 160, 165.1, 165.2, also performing functions, as previously described hereinabove.

Further provided in transceiver 200 are coupling elements 210a, 210b coupling voltages V1 and V2 to the inputs of mixers 165.1, 165.2. In the exemplary embodiment shown, the coupling elements 210a, 210b may be configured to selectively couple or decouple V1 and V2 with the inputs of mixers 165.1, 165.2, e.g., in response to the setting of a control signal (not shown). For example, in one configuration, the coupling elements 210a, 210b may act as signal feed-through paths coupling V1, V2 to mixers 165.1, 165.2 as V1', V2'. In an alternate configuration, the coupling elements may act as signal blocking elements (e.g., AC open circuits, or otherwise having high AC impedance) configured to decouple the matching network 120 from the mixers 165.1, 165.2.

In particular, when 210a, 210b are acting as signal feed-through paths, then the TX and RX are linked, and the system is in calibration mode. When 210a, 210b are acting as signal blocking elements, then the TX and RX are disconnected, and the system is not in calibration mode (i.e., the system could be in normal operation, or the entire system could be in an "off" state). Note the coupling elements 210a, 210b may be designed such that the relative amplitude and phase information between V1, V2 is substantially preserved between V1', V2'. In certain exemplary embodiments, the RF IN block 160 may be powered off during calibration, to avoid generating conflicting signals with V1', V2' sampled from V1, V2.

When the coupling elements 210a, 210b are configured as feed-through paths, it will be appreciated that mixers 165.1, 165.2 will function to down-convert the sampled voltages V1', V2' to an intermediate frequency (IF). In an exemplary embodiment, the IF may be zero (i.e., zero-IF), or alternatively, the IF may be close to zero (e.g., low-IF). The BB processor 230 may further process the outputs of mixers 165.1, 165.2.

In an exemplary embodiment, the BB processing block 230 is configured to digitally compute the real power delivered to the load ZL of the TX portion 201 from the down-converted versions of V1' and V2'. In this case, analog-to-digital converters (ADC's 230.1 and 230.2) may be interposed between the mixers 165.1, 165.2 and the BB processing block 230. It will be appreciated that, in this manner, the transmitter architecture 200 may advantageously utilize a single set of mixers 165.1, 165.2 for both the purpose of down-converting RX signals during normal operation, and the purpose of TX real-power detection as described herein.

Figure 3:
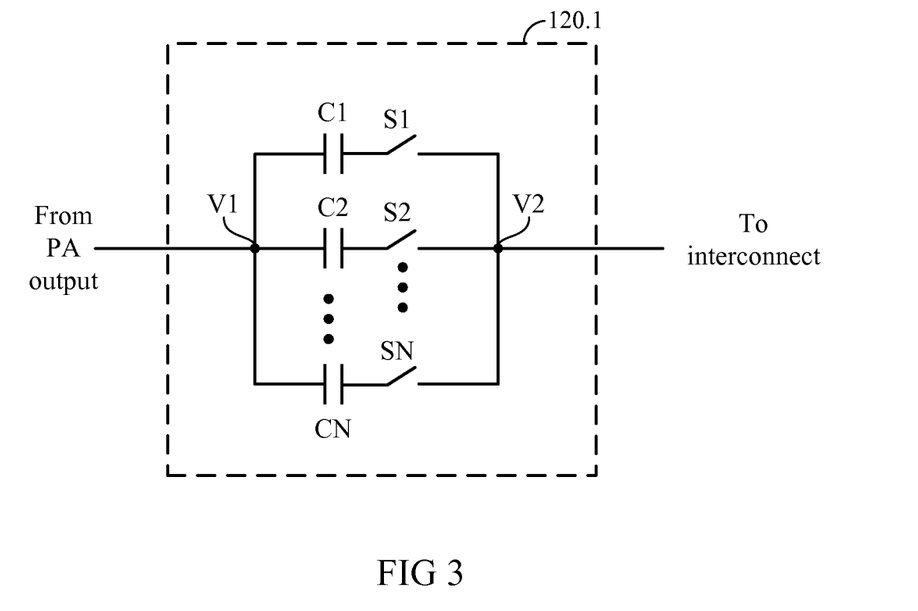
FIG. 3 illustrates an exemplary embodiment of a matching network according to the present disclosure.

In an exemplary embodiment, the matching network 120 may further be configurable, and implemented as shown in FIG. 3. In FIG. 3, an exemplary matching network 120.1 includes a plurality of capacitors C1, C2, . . . , CN coupled in parallel with each other. Each capacitor is further coupled in series with a corresponding switch (S1 through SN) configured to selectively enable or disable the capacitor to adjust the total capacitance of the matching network 120.1. In an exemplary embodiment, the capacitors C1, C2, . . . , CN are provided on-chip, i.e., integrated with the rest of the transceiver. Accordingly, the nodes at which voltages V1, V2 are sampled may advantageously correspond to readily accessible terminals of the on-chip matching network 120.1.

Assuming the matching network 120 of FIG. 2 is implemented as the exemplary matching network 120.1 of FIG. 3, the following expressions may be utilized to compute the real power delivered to the load from V1 and V2. Note these expressions are provided for exemplary purposes only, and are not meant to limit the scope of the present disclosure to any particular expression for P(L) or related quantities. The appropriate mathematical formulations and required baseband processing to derive the corresponding real power from the sampled voltages will be clear to one of ordinary skill in the art in light of the disclosure herein, and such details may depend on, e.g., the specific matching network and the nodes within the matching network at which the voltages are sampled. Such alternative exemplary embodiments are contemplated to be within the scope of the present disclosure.

In particular, the real power delivered to the load P(L) may be expressed as follows (Equation 1a):

$$P(L)=\text{Re}\{v2\cdot i^*(ZL)\};$$

wherein v1 and v2 (denoted with initial lower-case letters) are the complex baseband representations of V1 and V2, respectively, and i(ZL) is the complex baseband representation of the current through the load ZL 150, with i*(ZL) being the complex conjugate of i(ZL). In terms of v1 and v2, P(L) may in turn be expressed as (Equation 1b):

$$P(L)=\omega C|v1||v2|\sin(\theta_2-\theta_1);$$

wherein $(\theta_2-\theta_1)$ represents the relative phase difference between V1 and V2. Down-conversion of V1' and V2' by the mixers 165.1, 165.2 (e.g., multiplying LO_I with V1 and LO_Q with V2) generates the signals $y_1(t)$ and $y_2(t)$ as follows (Equations 2):

$$y_1(t)=\alpha|v1|\cdot\cos(\omega_{IF}t+\theta_1);\text{ and}$$

$$y_2(t)=\alpha|v2|\cdot\sin(\omega_{IF}t+\theta_2);$$

wherein α is related to the coupling element and mixer gain, and it is assumed the sampling paths for V1 and V2 have identical gain. Note the assumption of identical gain for the V1, V2 sampling paths is made for simplicity of illustration only; it will be appreciated that this assumption need not hold for correct operation of the techniques disclosed herein.

Following down-conversion, $y_1(t)$ and $y_2(t)$ may be multiplied with each other, and the result low-pass filtered to remove frequency sum components at $2\omega_{IF}$, resulting in the following (Equation 3):

$$z=0.5\,\alpha^2|v1||v2|\sin(\theta_2-\theta_1).$$

One of ordinary skill in the art will appreciate that the computed value of z may readily be used to determine P(L), e.g., according to Equation 1b hereinabove.

In an exemplary embodiment, the multiplication and low-pass filtering operations performed in Equation 3 may be digitally implemented in the baseband processing block 230. Thus, in addition to performing RX baseband operations associated with processing a receive signal for the RX portion 202, the baseband processing 230 may further be configured to perform processing to determine the real power delivered to the TX load 150, as described hereinabove.

Figure 4:
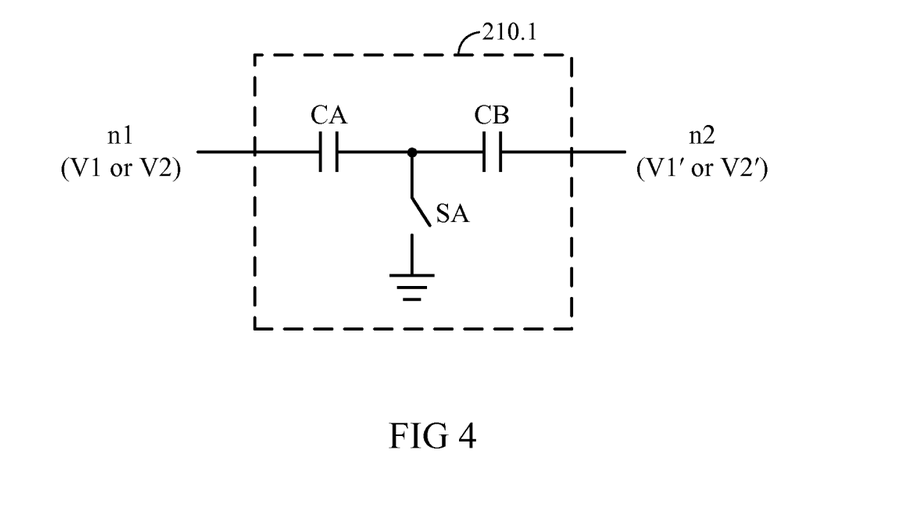
FIG. 4 illustrates an exemplary embodiment of a coupling element according to the present disclosure.

FIG. 4 illustrates an exemplary embodiment of a coupling element 210.1 according to the present disclosure. The coupling element 210.1 may be incorporated, e.g., as coupling element 210a and/or 210b of transceiver 200 in FIG. 2. Note FIG. 4 is shown for illustrative purposes only, and is not meant to limit the scope of the present disclosure to any particular implementation of a coupling element.

In FIG. 4, a first capacitor CA is coupled to a first node n1, which is coupled to the voltage V1 or V2 from the matching network 120. A second capacitor CB is coupled in series with CA, and further coupled to a second node n2, which is coupled to the voltage V1' or V2' provided to either of mixers 165.1 or 165.2. A switch SA selectively couples the node between CA and CB to an RF ground voltage. In an exemplary embodiment, when switch SA is closed, then the RX portion 202 is decoupled from the TX portion 201, as the voltages V1 and V2 from the matching network 120 are effectively shorted to RF ground by the capacitor CA and SA.

In an exemplary embodiment, capacitors CA and CB may be configured to have low capacitance, i.e., high impedance at signal frequencies. In this manner, signals coupled from n1 to n2 may experience significant attenuation when SA is open, i.e., V1', V2' may be significantly attenuated relative to V1, V2. Such attenuation may be desirable from a system design perspective, as it is generally advantageous to attenuate V1, V2 (which are generated at the TX portion 201, and hence may have significant power) prior to coupling to mixers 165.1, 165.2 in the RX portion 202, to avoid saturating the RX portion 202. On the other hand, when SA is closed, not only will the signals V1, V2 be decoupled from V1', V2', but further, the loading effect of CB on the RX portion 202 will be negligible, if CB has low capacitance.

It will thus be appreciated that implementing the coupling elements 210a, 210b as shown advantageously selectively couples V1, V2 to the mixer inputs, without requiring any elements to be directly coupled in series with the receive path of RX portion 202 receive signal path (e.g., in series between RF IN 160 and mixers 165.1, 165.2). Note the capacitors CA and CB may be implemented as on-chip capacitors having a relatively small die area, and may thereby have negligible loading effects on the RX and TX portions. The capacitors CA and CB further advantageously do not consume static power.

In alternative exemplary embodiments (not shown), the switch SA may be replaced or augmented with one or more additional switches coupled in series with n1 and n2. For example, a switch may be placed in series between CA and CB, such that opening the switch decouples n1 from n2, while closing the switch couples n1 and n2. Such alternative exemplary embodiments are contemplated to be within the scope of the present disclosure.

Figure 5:
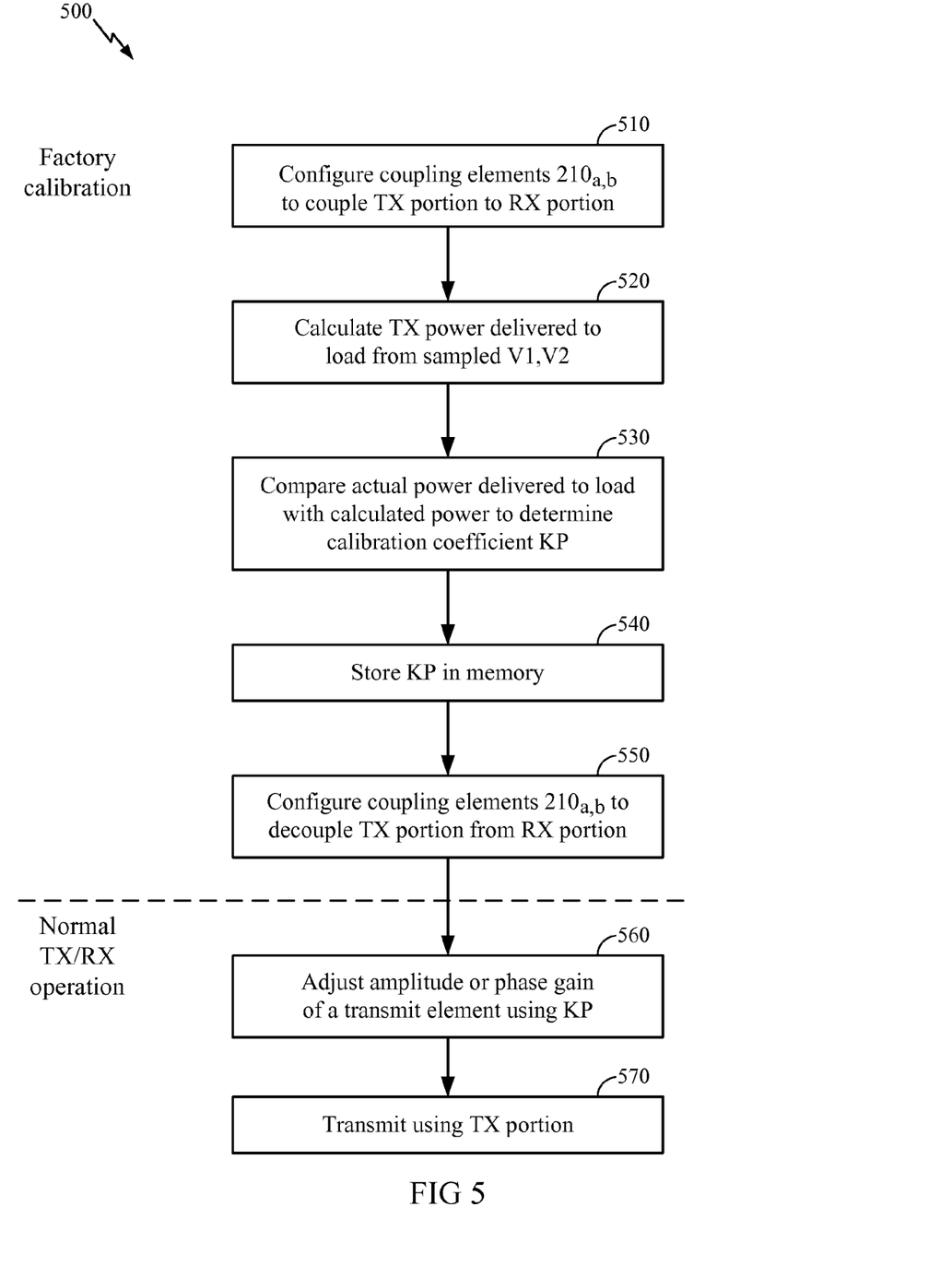
FIG. 5 illustrates an exemplary embodiment of a method according to the present disclosure.

FIG. 5 illustrates an exemplary embodiment of a calibration and operation scheme 500 for a transceiver according to the present disclosure. Note the scheme is shown for illustrative purposes only, and is not meant to limit the scope of the present disclosure. In FIG. 5, blocks 510 through 550 may be performed during a factory calibration phase, while blocks 560 through 570 may be performed during a normal TX/RX operation phase, as further described hereinbelow.

At block 510, coupling elements 210a, 210b are configured to couple the TX portion 201 to the RX portion 202. For example, according to an exemplary embodiment wherein the coupling elements 210a, 210b are implemented using the architecture 210.1 shown in FIG. 4, the switch SA may be opened as previously described herein to couple the voltages V1, V2 to the mixers 165.1, 165.2.

At block 520, the real power delivered to the TX load is calculated using the sampled voltages V1, V2. In an exemplary embodiment, the calculation may be digitally performed using the baseband processor 230.

At block 530, the actual power delivered to the load is compared with the calculated power to determine a calibration coefficient, KP, representing the ratio between the estimated power (e.g., as computed using Equation 3) and the actual power. In an exemplary embodiment, the actual power may be measured using test equipment during factory calibration of the system. Note the determination of the calibration coefficient KP may include measuring such actual power delivered to the load using such test equipment. In an exemplary embodiment, the coefficient KP may subsequently be used as, e.g., to pre-adjust the gain of the PA 110, or to adjust the configuration of the matching network 120 or other element of the TX portion 201, such that the actual power delivered to the load 150 approximates the desired value.

At block 540, the coefficient KP is stored in a memory accessible to the TX portion 201. In exemplary embodiments, the memory (not shown in FIG. 2) may be integrated with the rest of the transceiver 200, or it may be separately provided.

At block 550, the coupling elements 210a, 210b are configured to decouple the TX portion 201 from the RX portion 202. In an exemplary embodiment, the switch SA may be closed as described hereinabove.

At block 560, the amplitude or phase gain of a transmit element may be adjusted using the stored coefficient KP.

At block 570, the adjusted TX signal is transmitted. In an exemplary embodiment, the down-conversion mixers 165.1, 165.2 may further be used to down-convert a receive signal for receive processing by the RX portion 202.

In light of the present disclosure, one of ordinary skill in the art will appreciate that any of the techniques described above may be practiced independently or in conjunction with each other, and with other techniques not explicitly mentioned herein. Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, VLSI Library elements, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   a matching network coupling an output of an amplifier to a load;
   first and second down-conversion mixers having inputs coupled to a radio frequency (RF) input, the first and second down-conversion mixers disposed in a receive signal path between the RF input and a processor configured for baseband processing;
   a first coupling element configured to selectively couple or decouple a first voltage sampled across the matching network to the input of the first down-conversion mixer, the input of the first down-conversion mixer being disposed in the receive path between the RF input and the first down-conversion mixer; and
   a second coupling element configured to selectively couple or decouple a second voltage sampled across the matching network to the input of the second down-conversion mixer, the input of the second down-conversion mixer being disposed in the receive path between the RF input and the second down-conversion mixer, the first voltage being distinct from the second voltage,
wherein the processor is configured to calculate a real power delivered to the load based on outputs of the first and second down-conversion mixers.

2. The apparatus of claim 1, each of the first and second coupling elements comprising a switch selectively coupling or decoupling a node of the coupling element to ground.

3. The apparatus of claim 2, wherein each of the first and second coupling elements comprises a first capacitor coupled in series with a second capacitor, and wherein the node is between the first capacitor and the second capacitor.

4. The apparatus of claim 1, the first down-conversion mixer configured to multiply the first sampled voltage with a first local oscillator signal, the second down-conversion mixer configured to multiply the second sampled voltage with a second local oscillator signal having a quadrature phase difference with the first local oscillator signal.

5. The apparatus of claim 4, wherein frequencies of the first and second local oscillator signals correspond to a carrier frequency of the output signal of the amplifier.

6. The apparatus of claim 1, further comprising analog-to-digital converters to convert the outputs of the first and second mixers to digital representation, the processor configured to calculate said real power in the digital domain.

7. The apparatus of claim 6, further comprising low-pass filters to filter the outputs of the first and second down-conversion mixers prior to coupling to the analog-to-digital converters.

8. The apparatus of claim 7, the processor configured to calculate the real power by multiplying the low-pass-filtered digitized outputs of the first and second mixers with each other.

9. The apparatus of claim 1, further comprising:
a memory for storing a coefficient computed by the processor, wherein a gain of the amplifier is adjusted based on the stored coefficient.

10. The apparatus of claim 1, the matching network having a configurable impedance.

11. The apparatus of claim 10, further comprising:
a memory for storing a coefficient computed by the processor, wherein the impedance of the matching network is configured based on the stored coefficient.

12. The apparatus of claim 10, the matching network comprising a plurality of capacitors coupled in parallel, each capacitor further coupled in series with a switch for selectively enabling the corresponding capacitor.

13. A method comprising:
configuring a first coupling element to couple a first voltage sampled from a first node of a matching network to an input of a first down-conversion mixer,
configuring a second coupling element to couple a second voltage sampled from a second node of the matching network distinct from the first node to an input of a second down-conversion mixer, wherein the matching network couples an output of an amplifier to a load, and wherein the first and second down-conversion mixers are disposed in a receive signal path between a radio frequency input and a baseband processor;
down-converting the two first and second sampled voltages in frequency using the first and second down-conversion mixers;
calculating a real power delivered to the load from the down-converted voltages;
storing a coefficient derived from comparing the calculated real power to an actual power;
configuring the first and second coupling elements to decouple the first and second voltages from the inputs of the first and second down-conversion mixers;
adjusting the amplitude or phase gain of a transmit element using the stored coefficient; and
down-converting a received signal using the first and second down-conversion mixers.

14. The method of claim 13, the configuring the first and second coupling elements to couple comprising opening a switch coupling each coupling element to ground.

15. The method of claim 13, the configuring the first and second coupling elements to decouple comprising closing a switch coupling each coupling element to ground.

16. The method of claim 13, the down-converting the first and second sampled voltages comprising:
multiplying the first sampled voltage with a first local oscillator signal with the first down-conversion mixer; and
multiplying the second sampled voltage with a second local oscillator signal with the second down-conversion mixer, wherein the second local oscillator signal has a quadrature phase relationship with the first local oscillator signal.

17. The method of claim 13, the calculating the power delivered to the load comprising processing the down-converted sampled voltages digitally using a baseband processor.

18. The method of claim 13, the adjusting the amplitude or phase gain of a transmit element comprising adjusting the gain of a power amplifier.

19. The method of claim 13, the adjusting the amplitude or phase gain of a transmit element comprising adjusting the impedance of the matching network.

20. The method of claim 13, the received signal comprising a signal received wirelessly over an antenna and amplified by a low-noise amplifier.

21. The method of claim 13, the matching network comprising a plurality of capacitors coupled in parallel, each capacitor configured to be selectively enabled or disabled by a series-coupled switch.

22. An apparatus comprising:
means for matching the output of an amplifier to a load;
means for processing a baseband signal;
first means for selectively coupling or decoupling a first voltage sampled across the means for matching to an input of a first and down-conversion mixer in a receive signal path between a radio frequency input and the means for processing a baseband signal;
and second means for selectively coupling or decoupling a second voltage sampled across the means for matching to an input of a second down-conversion mixer in the receive signal path between the radio frequency input and the means for processing a baseband signal,
wherein the first voltage is distinct from the second voltage, and
wherein the means for processing a baseband signal comprises means for calculating a real power delivered to the load from the down-converted voltages.

23. The apparatus of claim 22, further comprising a receiver front end coupled to the first and second down-conversion mixers.

24. The apparatus of claim 22, further comprising means for adjusting the parameter of a transmit element based on the calculated real power.

* * * * *